(12) United States Patent
Park et al.

(10) Patent No.: US 11,674,875 B2
(45) Date of Patent: Jun. 13, 2023

(54) FLUID MEDIUM MONITORING APPARATUS

(71) Applicants: ZEUS CO., LTD., Hwaseong-si (KR); ZEUS ENP CO., LTD., Sejong-si (KR)

(72) Inventors: Hyun Kook Park, Ansan-si (KR); Chang Ho Choi, Guri-si (KR); Seong Hwan Park, Cheongju-si (KR)

(73) Assignees: ZEUS CO., LTD., Hwaseong-si (KR); ZEUS ENP CO., LTD., Sejong-si (KR)

( * ) Notice: Subject to any disclaimer, the term of this patent is extended or adjusted under 35 U.S.C. 154(b) by 0 days.

(21) Appl. No.: 17/269,162

(22) PCT Filed: Mar. 20, 2020

(86) PCT No.: PCT/KR2020/003822
§ 371 (c)(1),
(2) Date: Feb. 17, 2021

(87) PCT Pub. No.: WO2020/230995
PCT Pub. Date: Nov. 19, 2020

(65) Prior Publication Data
US 2022/0057314 A1    Feb. 24, 2022

(30) Foreign Application Priority Data
May 13, 2019  (KR) .................. 10-2019-0055827

(51) Int. Cl.
*G01N 15/06*  (2006.01)
*H01L 21/67*  (2006.01)
(Continued)

(52) U.S. Cl.
CPC .............. *G01N 15/06* (2013.01); *G01N 21/05* (2013.01); *G01N 21/31* (2013.01);
(Continued)

(58) Field of Classification Search
CPC .......... G01N 15/06; G01N 2015/0053; G01N 2015/0693; H01L 21/67253
(Continued)

(56) References Cited

U.S. PATENT DOCUMENTS

| | | | |
|---|---|---|---|
| 4,368,047 A * | 1/1983 | Andrade | G01N 33/582 436/805 |
| 4,771,629 A * | 9/1988 | Carlson | G01J 3/42 73/23.35 |

(Continued)

FOREIGN PATENT DOCUMENTS

| | | |
|---|---|---|
| CN | 1339610 | 3/2002 |
| CN | 1717581 | 1/2006 |

(Continued)

OTHER PUBLICATIONS

International Search Report, with English translation, for International Application No. PCT/KR2020/003822, dated Jun. 17, 2020.
(Continued)

*Primary Examiner* — Tarifur R Chowdhury
*Assistant Examiner* — Omar H Nixon
(74) *Attorney, Agent, or Firm* — Kile Park Reed & Houtteman PLLC

(57) ABSTRACT

A fluid medium monitoring apparatus of the present invention comprises: a light source unit for irradiating light; a first collimator unit for collimating light irradiated from the light source unit; a flow cell unit in which a fluid medium flows and light is allowed to absorb the wavelength of the fluid medium while proceeding along the moving direction of the fluid medium; and a light detection unit for detecting the wavelength of the light passing through the flow cell unit.

12 Claims, 3 Drawing Sheets

(51) Int. Cl.
  *G01N 21/05* (2006.01)
  *G01N 21/31* (2006.01)
  *G01N 15/00* (2006.01)

(52) U.S. Cl.
  CPC ............ *H01L 21/67253* (2013.01); *G01N 2015/0053* (2013.01); *G01N 2015/0693* (2013.01); *G01N 2021/054* (2013.01)

(58) Field of Classification Search
  USPC ........................................................ 356/442
  See application file for complete search history.

(56) References Cited

U.S. PATENT DOCUMENTS

| | | | | |
|---|---|---|---|---|
| 2007/0146704 | A1* | 6/2007 | Schmidt | G01J 3/26 356/417 |
| 2010/0009458 | A1* | 1/2010 | Ohtsuka | G01N 21/6428 436/166 |
| 2011/0284768 | A1* | 11/2011 | Takahashi | G01N 21/648 250/459.1 |
| 2012/0262711 | A1* | 10/2012 | Oda | G01J 3/4406 250/226 |
| 2014/0070101 | A1* | 3/2014 | Matsushima | G01N 21/3504 250/338.5 |
| 2018/0364152 | A1* | 12/2018 | Naor | G01N 21/05 |
| 2019/0195784 | A1* | 6/2019 | Taniguchi | G01N 21/3504 |

FOREIGN PATENT DOCUMENTS

| | | | |
|---|---|---|---|
| CN | 104280355 B | * | 7/2017 |
| CN | 206906244 U | * | 1/2018 |
| CN | 113358604 A | * | 9/2021 |
| CN | 113659220 A | * | 11/2021 |
| KR | 10-2014-0118864 | | 10/2014 |
| KR | 10-1785859 | | 10/2017 |
| KR | 10-2017-0134742 | | 12/2017 |
| KR | 10-2018-0027331 | | 3/2018 |
| TW | 201307620 | | 2/2013 |
| WO | 2007-062800 | | 6/2007 |
| WO | 2016-171042 | | 10/2016 |

OTHER PUBLICATIONS

Written Opinion for International Application No. PCT/KR2020/003822, dated Jun. 17, 2020.

* cited by examiner

FLUID MEDIUM MONITORING APPARATUS

CROSS-REFERENCE TO RELATED APPLICATION(S)

This application is a national entry of International Application No. PCT/KR2020/003822, filed on Mar. 20, 2020, which claims under 35 U.S.C. § 119(a) and 365(b) priority to and benefits of Korean Patent Application No. 10-2019-0055827, filed on May 13, 2019 in the Korean Intellectual Property Office, the entire contents of which are incorporated herein by reference.

TECHNICAL FIELD

The present invention relates to a fluid medium monitoring apparatus, and more particularly, to a fluid medium monitoring apparatus capable of accurately monitoring a state of a fluid medium under usage conditions of the fluid medium.

BACKGROUND ART

Generally, etching processes are performed in a semiconductor manufacturing process such as a semiconductor wafer manufacturing process, a solar cell manufacturing process, or the like. In the etching process, a high-temperature etching solution (a fluid medium) such as a phosphoric acid solution is used for etching a silicon nitride film. In the semiconductor wafer manufacturing process, since an eluate such as silicon is dissolved and contained in an etching solution, a concentration of the eluate in the etching solution increases as an etching process of the semiconductor wafer proceeds. When the concentration of the eluate in the etching solution is increased by a certain concentration or higher, the etching solution is replaced.

Since it is difficult to perform microanalysis on a concentration of silicon in an etching solution at a high temperature, some of the etching solution is collected and cooled to room temperature. In order to increase detection sensitivity of the cooled etching solution, a concentration of the etching solution is detected after performing chemical treatment on the etching solution multiple times.

However, in the related art, since an etching solution is cooled to room temperature and then chemical treatment is performed on the etching solution multiple times, a range of detection errors is increased according to a temperature difference of the etching solution. Therefore, it is difficult to accurately predict a state of the etching solution under usage conditions applied in an actual semiconductor process.

Further, since the eluate is easily extracted from the etching solution when the high-temperature etching solution is lowered to room temperature, it may be difficult to accurately measure the concentration of the eluate in the etching solution.

Further, since chemical treatment is performed on the etching solution multiple times in order to accurately measure the concentration of the etching solution, a matrix is complicated during concentration analysis such that accuracy of the analyzed concentration is lowered.

The background art of the present invention is disclosed in Korean Patent Registration No. 1785859 (Registered on Sep. 29, 2017, Title of the present invention: "FLUORESCENT SILICON NANOPARTICLE FOR DETECTING COPPER ION, METHOD FOR PREPARING THE SAME, AND ION DETECTING SENSOR USING THE SAME").

DISCLOSURE

Technical Problem

The present invention is directed to providing a fluid medium monitoring apparatus capable of accurately monitoring a state of a fluid medium under usage conditions of the fluid medium.

Technical Solution

One aspect of the present invention provides a fluid medium monitoring apparatus including a light source unit configured to apply light, a first collimator unit configured to collimate light applied from the light source unit, a flow cell unit in which a fluid medium flows and light is allowed to absorb a wavelength of the fluid medium while proceeding in a moving direction of the fluid medium, and a light detection unit configured to detect a wavelength of the light passing through the flow cell unit.

The light detection unit may include a second collimator unit configured to collect the light passing through the flow cell unit, and a light detection unit configured to detect a wavelength of light passing through the second collimator unit.

The light source unit may include a light-emitting lamp configured to apply light, and a convex lens unit configured to collect the light applied from the light-emitting lamp.

The first collimator unit may make angles of pieces of light, which has a predetermined angle incident from the light source unit, parallel.

The second collimator unit may collect parallel light passing through the flow cell unit to the light detection unit.

The fluid medium monitoring apparatus may further include a noise reduction unit installed on the light detection unit to cool the light detection unit.

The fluid medium monitoring apparatus may further include a slit unit configured to diffract the light while the light applied from the second collimator unit passes therethrough, and a wavelength selection unit disposed between the slit unit and the light detection unit to split light incident from the slit unit to the light detection unit in a spectrum manner.

The fluid medium monitoring apparatus may further include a detection wavelength adjuster configured to adjust a wavelength of light applied to the light detection unit by rotating the wavelength selection unit.

The fluid medium monitoring apparatus may further include a wavelength selection unit disposed between the light source unit and the first collimator unit to split light incident from the light source unit in a spectrum manner.

The fluid medium monitoring apparatus may further include a first optical fiber unit connected to the light source unit and the first collimator unit to form an optical path so that the light applied from the light source unit is applied to the first collimator unit.

The fluid medium monitoring apparatus may further include a second optical fiber unit configured to form an optical path so that light applied through the flow cell unit is applied to the light detection unit.

Advantageous Effects

According to the present invention, since light proceeds in a flow cell unit in a moving direction of a fluid medium, scattering and refraction of the light due to bubbles or eluates when the light passes through the fluid medium can be minimized so that light loss can be reduced.

Further, according to the present invention, since a high-temperature fluid medium is introduced into the flow cell unit and light is applied to the fluid medium, it is not necessary to chemically treat the fluid medium multiple times in order to measure the concentration of the fluid medium and increase detection sensitivity of the fluid medium under conditions in which the fluid medium is used in an actual semiconductor process.

MODES OF THE INVENTION

Figure 1:
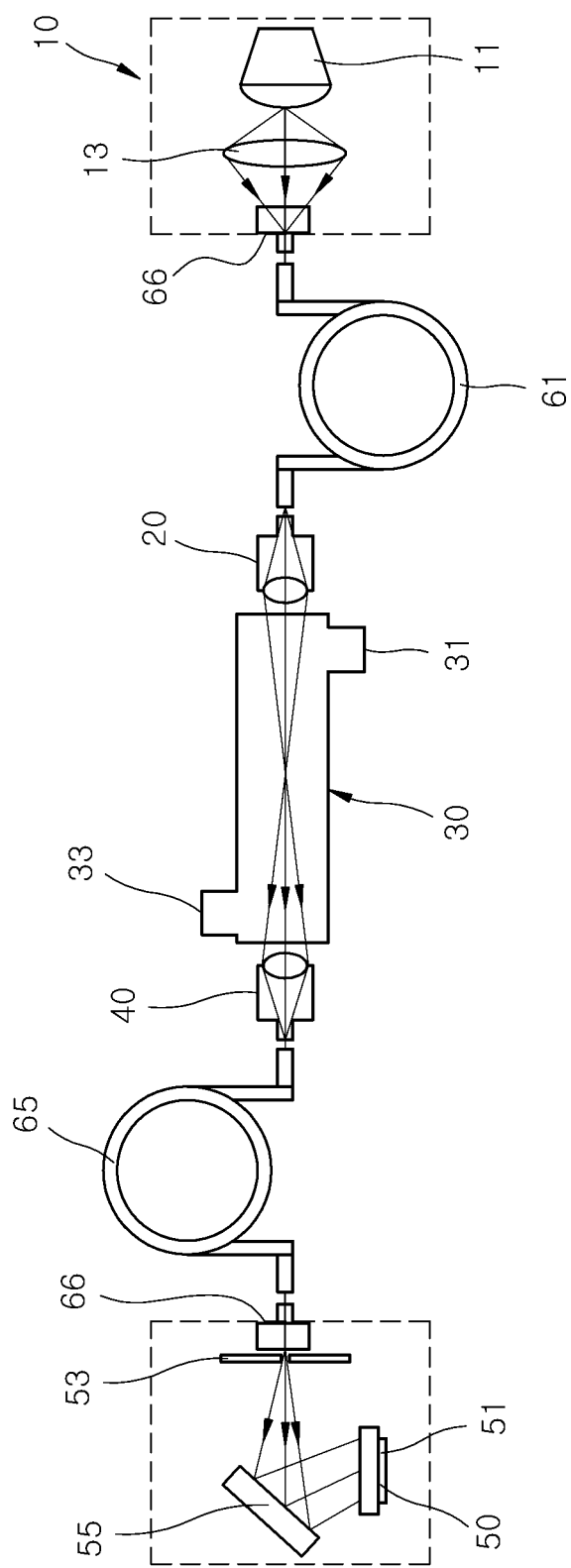
FIG. 1 is a configuration diagram illustrating a fluid medium monitoring apparatus according to a first embodiment of the present invention.

Hereinafter, embodiments of a fluid medium monitoring apparatus according to the present invention will be described with reference to the accompanying drawings. In a process of describing the fluid medium monitoring apparatus, thicknesses of lines, sizes of components, and the like illustrated in the drawings may be exaggerated for clarity and convenience of description. Further, some terms which will be described below are defined in consideration of functions in the present invention and meanings may vary depending on, for example, a user or operator's intentions or customs. Therefore, the meanings of these terms should be interpreted based on the scope throughout this specification.

First, a fluid medium monitoring apparatus according to a first embodiment of the present invention will be described.

FIG. 1 is a configuration diagram illustrating the fluid medium monitoring apparatus according to the first embodiment of the present invention.

Referring to FIG. 1, the fluid medium monitoring apparatus according to the first embodiment of the present invention includes a light source unit 10, a first collimator unit 20, a flow cell unit 30, and light detection units 40 and 50.

The light source unit 10 applies light. In this case, the light source unit 10 includes a light-emitting lamp 11 which applies light and a convex lens unit 13 which collects the light applied from the light-emitting lamp 11. As the light-emitting lamp 11, an ultraviolet lamp which applies ultraviolet rays (UV) in a wavelength range of 150 to 450 nm may be applied.

The first collimator unit 20 collimates the light applied from the light source unit 10 in a parallel manner. Since the first collimator unit 20 collimates the light in the parallel manner, the light is incident on the flow cell unit 30 in the parallel manner. Of course, the first collimator unit 20 may apply the light applied from the light source unit 10 to be slightly refracted or apply the light so that wavelengths of the light cross, according to optical design.

The first collimator unit 20 applies pieces of light having a predetermined angle passing through the convex lens unit 13 to be parallel to an inside of the flow cell unit 30.

The flow cell unit 30 allows a fluid medium to flow and allows light to absorb a wavelength of the fluid medium while proceeding in a moving direction of the fluid medium. A flow chamber (not illustrated) is formed inside the flow cell unit 30 so that the fluid medium flows. Since the light proceeds in the flow cell unit 30 in the moving direction of the fluid medium, scattering and refraction of the light due to bubbles or eluates when the light passes through the fluid medium may be minimized so that light loss may be reduced. Further, wavelengths of eluates contained in the fluid medium may be smoothly absorbed while the light passes through the fluid medium, and thus light detection efficiency may be improved.

The fluid medium may be an etching solution which is used in a semiconductor process when a semiconductor wafer, a solar cell, or the like is manufactured. The etching solution may include a phosphoric acid solution of 150 to 200° C. The flow cell unit 30 may be formed of a quartz material, a Pyrex glass, or a Teflon material that may prevent heat deformation and corrosion by a high-temperature etching solution.

An inlet pipe 31 is connected to a lower portion of the flow cell unit 30 so that the fluid medium is introduced, and a discharge pipe 33 is formed on an upper portion of the flow cell unit 30 so that the flowing fluid medium is discharged from the flow cell unit 30. In this case, the light proceeds in a longitudinal direction of the flow cell unit 30. Since the inlet pipe 31 is connected to the lower portion of the flow cell unit 30 and the discharge pipe 33 is connected to the upper portion of the flow cell unit 30, the fluid medium flows from a lower side to an upper side of the flow cell unit 30. Further, most of the bubbles contained in the fluid medium flow across a diameter of the flow cell unit 30 and then flow along the upper side of the flow cell unit 30, and thus it is possible to minimize occurrence of light loss due to the bubbles when the light flows along an inside of the flow cell unit 30.

The fluid medium heated at 150 to 200° C. flows through the flow cell unit 30 to suppress extraction of the materials contained in the fluid medium. Further, a high-temperature fluid medium may flow through the flow cell unit 30 so that the wavelength of the heated fluid medium is absorbed by the light.

Therefore, in order to measure a concentration of the fluid medium under conditions in which the fluid medium is used in an actual semiconductor process and to increase detection sensitivity of the fluid medium, it is not necessary to chemically treat the fluid medium multiple times. Further, since it is not necessary to cool the fluid medium to room temperature, detection errors may be prevented from occurring due to a temperature difference of the fluid medium and a state of the fluid medium may be accurately predicted under usage conditions applied in the actual semiconductor process. Further, a matrix may be simplified during concentration analysis so that accuracy of the analyzed concentration may be improved.

The light detection units 40 and 50 detect the wavelength of the light applied through the flow cell unit 30. The light detection units 40 and 50 may detect the wavelength which is absorbed while the light passes through the fluid medium and analyze data transmitted from the light detection units 40 and 50 to measure a concentration of the eluate contained in the fluid medium.

The light detection units 40 and 50 include a second collimator unit 40 which collects the light passing through the flow cell unit 30, and the light detection unit 50 which detects the wavelength of the light applied from the second collimator unit 40.

The second collimator unit 40 collects parallel light applied from the flow cell unit 30. Since the parallel light is collected while passing through the second collimator unit 40, detection efficiency in the light detection unit 50 may be improved.

The light detection unit 50 detects the wavelength of the light applied from the second collimator unit 40. The light detection unit 50 may detect the wavelength which is absorbed while the light passes through the fluid medium and analyze data transmitted from the light detection unit 50 to measure the concentration of the eluate contained in the fluid medium.

The light detection unit 50 may be a charge-coupled device (CCD) module capable of simultaneously scanning a plurality of wavelengths. Therefore, the light detection unit 50 scans a plurality of wavelengths at once, and thus a light detection time of the light detection unit 50 may be significantly reduced.

The fluid medium monitoring apparatus further includes a noise reduction unit 51 which is installed on the light detection unit 50 to cool the light detection unit 50. The noise reduction unit 51 may be a cooling element or cooling device which reduces noise of the light detection unit 50 by cooling the light detection unit 50. Since the noise reduction unit 51 suppresses overheating of the light detection unit 50, noise of detection signals may be reduced.

The fluid medium monitoring apparatus further includes a slit unit 53 which diffracts the light while the parallel light applied from the second collimator unit 40 passes therethrough, and a wavelength selection unit 55 which is disposed between the slit unit 53 and the light detection unit 50 and splits light incident from the slit unit 53 in a spectrum manner. As the wavelength selection unit 55, a diffraction grating which splits light into a plurality of wavelengths in the spectrum manner may be applied. The diffraction grating splits light into a plurality of wavelengths in an almost parallel manner and the spectrum manner. Since the slit unit 53 and the wavelength selection unit 55 split the light into the plurality of wavelengths in the spectrum manner, the light detection unit 50 detects the plurality of wavelengths in a short period of about 5 to 10 msec. Therefore, a scan time of the light detection unit 50 is significantly reduced.

The fluid medium monitoring apparatus further includes a first optical fiber unit 61 which is connected to the light source unit 10 and the first collimator unit 20 and forms an optical path so that the light applied from the light source unit 10 is applied to the first collimator unit 20. The first collimator unit 20 and the first optical fiber unit 61 are connected by a first optical fiber coupler 62.

Since the light source unit 10 may be installed at various positions regardless of the installation position of the flow cell unit 30, a degree of freedom of installation of the light source unit 10 and the flow cell unit 30 may be increased.

Further, since the first optical fiber unit 61 is connected to the light source unit 10 and the first collimator unit 20, the light source unit 10 may be installed to be spaced apart from the flow cell unit 30. A high-temperature fluid medium of about 150 to 200° C. passes through the flow cell unit 30 so that the flow cell unit 30 is heated by the high-temperature fluid medium. Since the light source unit 10 is installed to be spaced apart from the flow cell unit 30 by the first optical fiber unit 61, the light source unit 10 may be prevented from being overheated due to the heat of the flow cell unit 30. Further, in order to cool or thermally insulate the light source unit 10, it is not necessary to install a separate cooling device or thermal insulating member.

The fluid medium monitoring apparatus further includes a second optical fiber unit 65 which forms an optical path so that the parallel light applied through the flow cell unit 30 is applied to the light detection unit 50. In this case, the second optical fiber unit 65 is connected to the second collimator unit 40 on which the light is incident through the flow cell unit 30 and to the light detection unit 50. The second optical fiber unit 65 is connected to the light detection unit 50 by a second optical fiber coupler 66.

Further, the second optical fiber unit 65 may be connected to the flow cell unit 30 and the light detection unit 50.

Since the light detection unit 50 may be installed at various positions regardless of the installation position of the flow cell unit 30, a degree of freedom of installation of the light detection unit 50 and the flow cell unit 30 may be increased.

Further, since the second optical fiber unit 65 is connected to the light detection unit 50 and the second collimator unit 40, the light detection unit 50 may be provided to be spaced apart from the flow cell unit 30. A high-temperature fluid medium of about 150 to 200° C. passes through the flow cell unit 30 so that the flow cell unit 30 is heated by the high-temperature fluid medium. Since the light detection unit 50 is installed to be spaced apart from the flow cell unit 30 by the second optical fiber unit 65, the light detection unit 50 may be prevented from being overheated due to the heat of the flow cell unit 30. Further, in order to cool or thermally insulate the light detection unit 50, it is not necessary to install a separate cooling device or thermal insulating member.

In the fluid medium monitoring apparatus, only one of the first optical fiber unit 61 and the second optical fiber unit 65 may be installed or both of the first optical fiber unit 61 and the second optical fiber unit 65 may be installed. When the first optical fiber unit 61 and the second optical fiber unit 65 are installed on both sides of the flow cell unit 30, the flow cell unit 30, the light source unit 10, and the light detection unit 50 do not need to be arranged in a line, and thus a degree of freedom of installation of the fluid medium monitoring apparatus may be increased.

Further, in the fluid medium monitoring apparatus, the first optical fiber unit 61 and the second optical fiber unit 65 may not be installed. In this case, the light source unit 10 and the flow cell unit 30 may be connected by the first collimator unit 20, and the light detection unit 50 and the flow cell unit 30 may be connected by the second collimator unit 40.

Next, a fluid medium monitoring apparatus according to a second embodiment of the present invention will be described. In the second embodiment, components are substantially the same as those of the first embodiment except for a light detection unit and a detection wavelength adjuster. Therefore, the same reference numerals are assigned to the same components as the first embodiment and descriptions thereof will be omitted.

Figure 2:
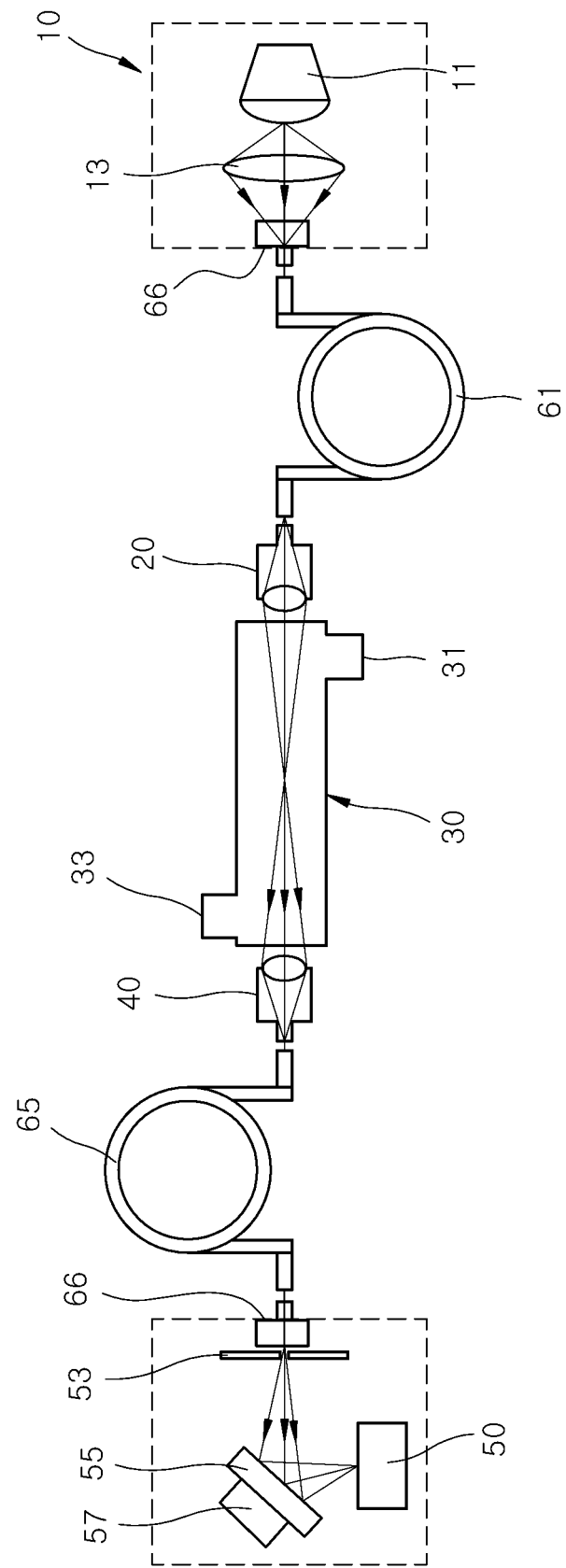
FIG. 2 is a configuration diagram illustrating a fluid medium monitoring apparatus according to a second embodiment of the present invention.

FIG. 2 is a configuration diagram illustrating the fluid medium monitoring apparatus according to the second embodiment of the present invention.

Referring to FIG. 2, the fluid medium monitoring apparatus according to the second embodiment of the present invention further includes a detection wavelength adjuster 57 which adjusts a wavelength of light applied to a light detection unit 50 by rotating a wavelength selection unit 55. As the detection wavelength adjuster 57, a step motor capable of rotating a wavelength selection unit 55 by one pitch is provided. Pieces of light having a specific unit wavelength is applied one by one to the light detection unit 50 each time the wavelength selection unit 55 is rotated by one pitch. A pitch angle of the detection wavelength adjuster 57 may be appropriately adjusted according to a range of the unit wavelength. When the piece of light having the unit wavelength is applied one by one to the light detection unit 50 while the detection wavelength adjuster 57 is rotated by one pitch, the light detection unit 50 detects and combines the plurality of unit wavelengths one by one. Therefore, it is possible to monitor a state such as a concentration of the fluid medium or the like by combining the plurality of unit wavelengths.

As the light detection unit 50, a photomultiplier tube (PMT) capable of sequentially detecting the unit wavelengths of the light applied from the wavelength selection unit 55 may be applied. When the PMT is applied, the unit wavelengths are sequentially read, and thus detection sensitivity may be significantly increased. Further, since it is necessary to combine the plurality of unit wavelengths, an analysis speed may be increased.

Next, a fluid medium monitoring apparatus according to a third embodiment of the present invention will be described. In the third embodiment, components are substantially the same as those of the first embodiment except for a wavelength selection unit. Therefore, the same reference numerals are assigned to the same components as the first embodiment and descriptions thereof will be omitted.

Figure 3:
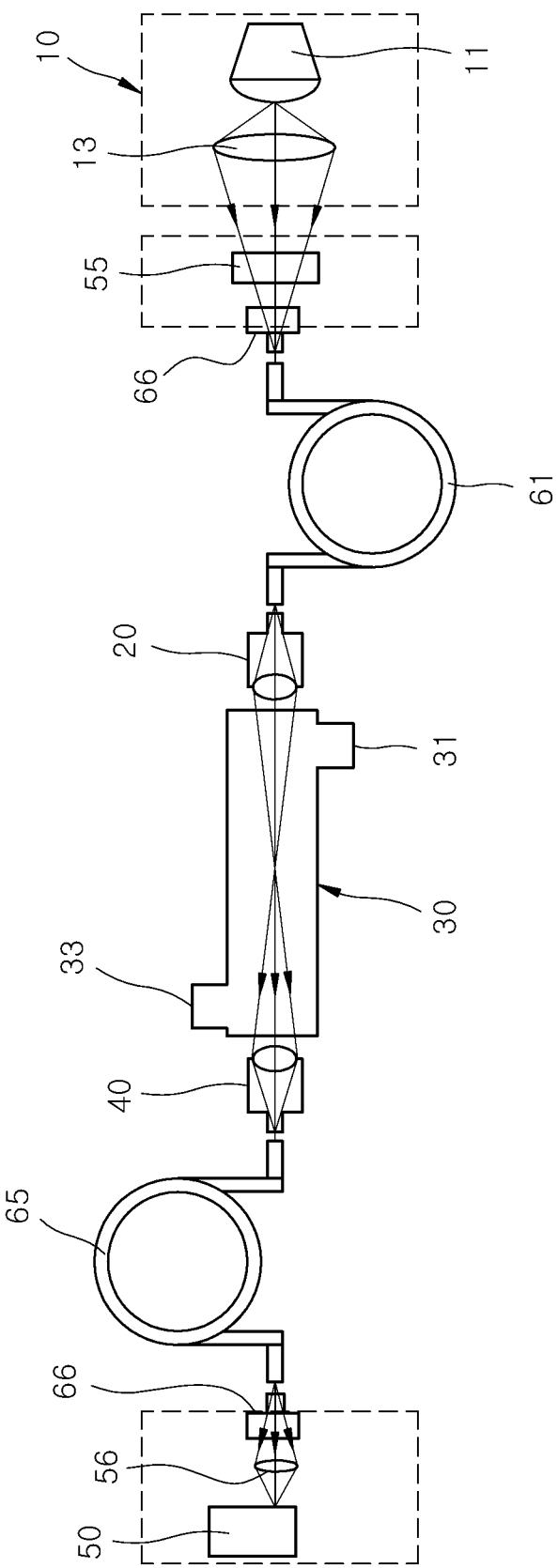
FIG. 3 is a configuration diagram illustrating a fluid medium monitoring apparatus according to a third embodiment of the present invention.

FIG. 3 is a configuration diagram illustrating the fluid medium monitoring apparatus according to the third embodiment of the present invention.

Referring to FIG. 3, the fluid medium monitoring apparatus according to the third embodiment of the present invention further includes a wavelength selection unit 55 which is disposed between a light source unit 10 and a first collimator unit 20 and splits light incident from the light source unit 10 in a spectrum manner. In this case, the wavelength selection unit 55 is disposed between a first optical fiber coupler 62 and a convex lens unit 13 of the light source unit 10.

The wavelength selection unit 55 selects one unit wavelength from among a plurality of unit wavelengths of light applied from the light source unit 10 and transmits the one unit wavelength to a first optical fiber unit 61. The light having the one unit wavelength reaches the first collimator unit 20, a flow cell unit 30, and a second collimator unit 40 through the first optical fiber unit 61 and reaches a light detection unit 50 through a second optical fiber unit 65. The one unit wavelength described above is defined as a wavelength that absorbs a wavelength of one type of eluate among a plurality of eluates contained in a fluid medium. Since the light having the one unit wavelength is applied to the flow cell unit 30 and the fluid medium absorbs the wavelength of one type of eluate, a background phenomenon in which spectrum disturbance occurs between the wavelengths when a plurality of types of eluates absorb the plurality of wavelengths may be prevented. Therefore, only a specific eluate contained in the fluid medium absorbs the unit wavelength, and thus the concentration of the fluid medium and the like may be detected more accurately.

A second convex lens 56 is disposed between the light detection unit 50 and a second optical fiber coupler 66. The second convex lens 56 collects light applied from the second optical fiber coupler 66 to the light detection unit 50. As a detection element, a PMT or avalanche photodiode (APD) with improved sensitivity may be applied.

The present invention has been described with reference to the examples illustrated in the drawings, but these are only examples. It will be understood by those skilled in the art that various modifications and equivalent other examples may be made.

Therefore, the scope of the present invention is defined by the appended claims.

The invention claimed is:

1. A fluid medium monitoring apparatus comprising:
    a light source configured to apply ultraviolet rays;
    a first collimator configured to align the ultraviolet rays applied from the light source as parallel rays;
    a flow cell in which a fluid medium in a liquid state flows and ultraviolet rays is allowed to absorb a wavelength of the fluid medium while proceeding in a moving direction of the fluid medium; and
    a light detector configured to detect a plurality of wavelengths of the ultraviolet rays passing through the flow cell,
    wherein the light detector includes:
        a second collimator configured to collect the ultraviolet rays passing through the flow cell;
        a charged-coupled device (CCD) configured to detect the plurality of wavelengths of ultraviolet rays passing through the second collimator; and
    a noise reducer including a cooling element disposed on the light detector with the cooling element being configured to reduce noise of the light detector by cooling the light detector,
    wherein the fluid medium monitoring apparatus further includes:
        a first optical fiber connected to the light source and the first collimator to form an optical path so that the ultraviolet rays applied from the light source is applied to the first collimator; and
        a second optical fiber configured to form an optical path so that ultraviolet rays applied through the flow cell is applied to the light detector, and
    wherein the light source includes:
        a light-emitting lamp configured to apply ultraviolet rays; and
        a convex lens configured to collect the ultraviolet rays applied from the light-emitting lamp.

2. The fluid medium monitoring apparatus of claim 1, wherein the first collimator makes angles of pieces of ultraviolet rays, which has a predetermined angle incident from the light source, parallel.

3. The fluid medium monitoring apparatus of claim 1, wherein the second collimator collects parallel ultraviolet rays passing through the flow cell to the charged-coupled device.

4. The fluid medium monitoring apparatus of claim 1, further comprising:
    a diffraction slit configured to diffract the ultraviolet rays while the ultraviolet rays applied from the second collimator passes therethrough; and
    a wavelength selector including a diffraction grating disposed between the diffraction slit and the charged-coupled device to split ultraviolet rays incident from the diffraction slit to the charged-coupled device in a spectrum manner.

5. The fluid medium monitoring apparatus of claim 4, further comprising a detection wavelength adjuster configured to adjust a wavelength of ultraviolet rays applied to the light detector by rotating the wavelength selector.

6. The fluid medium monitoring apparatus of claim 1, further comprising a wavelength selector disposed between the light source and the first collimator to split ultraviolet rays incident from the light source in a spectrum manner.

7. A fluid medium monitoring apparatus comprising:
a light source configured to apply ultraviolet rays;
a first collimator configured to align the ultraviolet rays applied from the light source as parallel rays;
a flow cell in which a fluid medium in a liquid state flows and ultraviolet rays is allowed to absorb a wavelength of the fluid medium while proceeding in a moving direction of the fluid medium; and
a light detector configured to detect a plurality of wavelengths of the ultraviolet rays passing through the flow cell,
wherein the light detector includes:
a second collimator configured to collect the ultraviolet rays passing through the flow cell; and
a charged-coupled device (CCD) configured to detect the plurality of wavelengths of ultraviolet rays passing through the second collimator,
wherein the fluid medium monitoring apparatus further includes:
a first optical fiber connected to the light source and the first collimator to form an optical path so that the ultraviolet rays applied from the light source is applied to the first collimator; and
a second optical fiber configured to form an optical path so that ultraviolet rays applied through the flow cell is applied to the light detector, and
wherein the light source includes:
a light-emitting lamp configured to apply ultraviolet rays; and
a convex lens configured to collect the ultraviolet rays applied from the light-emitting lamp.

8. The fluid medium monitoring apparatus of claim 7, wherein the first collimator makes angles of pieces of ultraviolet rays, which has a predetermined angle incident from the light source, parallel.

9. The fluid medium monitoring apparatus of claim 7, wherein the second collimator collects parallel ultraviolet rays passing through the flow cell to the charged-coupled device.

10. The fluid medium monitoring apparatus of claim 7, further comprising:
a diffraction slit configured to diffract the ultraviolet rays while the ultraviolet rays applied from the second collimator passes therethrough; and
a wavelength selector including a diffraction grating disposed between the diffraction slit and the charged-coupled device to split ultraviolet rays incident from the diffraction slit to the charged-coupled device in a spectrum manner.

11. The fluid medium monitoring apparatus of claim 10, further comprising a detection wavelength adjuster configured to adjust a wavelength of ultraviolet rays applied to the light detector by rotating the wavelength selector.

12. The fluid medium monitoring apparatus of claim 7, further comprising a wavelength selector disposed between the light source and the first collimator to split ultraviolet rays incident from the light source in a spectrum manner.

* * * * *